United States Patent [19]
> Bazin

[11] 4,409,545
[45] Oct. 11, 1983

[54] ELECTRONIC MEASURING DEVICE FOR A POLYPHASE NETWORK, IN PARTICULAR FOR THE MEASUREMENT OF POWER

[75] Inventor: Alain Bazin, Villejuif, France
[73] Assignee: Enertec, Montrouge, France
[21] Appl. No.: 233,426
[22] Filed: Feb. 11, 1981
[30] Foreign Application Priority Data Feb. 19, 1980 [FR] France ................................ 80 03565

[51] Int. Cl.³ ........................ G01R 19/00; G01R 1/20
[52] U.S. Cl. .................................... 324/107; 324/127; 324/142
[58] Field of Search ................ 324/107, 127, 102, 142
[56] References Cited
U.S. PATENT DOCUMENTS 4,158,810 6/1979 Leskovar ............................ 324/127

*Primary Examiner*—Ernest F. Karlsen
*Attorney, Agent, or Firm*—Dale Gaudier

[57] ABSTRACT

A device for measuring a quantity such as the electric power in a polyphase alternating current network including at least two phase conductors and a reference conductor, of the type comprising two measuring devices which are associated respectively with the two phases and the outputs from which are connected to a summation device.

A supply circuit connected to one of the phases is associated with the corresponding measuring device, and a device connected to the other phase ensures the supply to the other measuring device and to the summation device, the supply circuit and the supply device being connected through a high-impedance tie circuit, the summation device being supplied if at least one of the phases is under voltage with respect to the reference conductor.

13 Claims, 8 Drawing Figures

ELECTRONIC MEASURING DEVICE FOR A POLYPHASE NETWORK, IN PARTICULAR FOR THE MEASUREMENT OF POWER

TECHNICAL FIELD

The present invention relates to devices for producing a signal which is a function of a number of quantities measured in a number of phases of a circuit for polyphase electric power distribution, especially devices the output signal from which is a function of the power flowing through one or more of the said phases.

BACKGROUND ART

It is known that the power consumed in a polyphase electric network is the sum of the powers effectively consumed in each of the phases and polyphase power meters include for this purpose devices which enable electric parameters relating to a number of phases to be measured in order to determine the corresponding power.

A power meter has recently been proposed, for example, in U.S. Pat. No. 4,359,684, which includes an electronic measuring device which receives at its inputs a signal representative of the current in one phase with which it is associated and a signal representative of the supply voltage from this phase, and emits at its output a train of pulses the frequency of which is proportional to the power flowing through this phase.

In a polyphase meter operating on this principle a number of electronic measuring devices are employed, each associated with a respective phase the output pulses from which are then summed in order to obtain the measure of the total power by means of a suitable summation circuit.

Certain of these electronic measuring devices are designed in order to derive their input signals from the associated phase without the agency of voltage or current transformers. A signal representative of the current is in particular derived from the voltage drop at the terminals of a shunt connected in this phase. A signal representative of the voltage is obtained by means of a voltage divider and a supply circuit produces at the input to the measuring device a continuous voltage which is substantially stable with respect to the phase voltage without employing any transformer.

Thus the electronic measuring device and its associated supply circuit "float" with the phase voltage, a high-impedance circuit providing the electric continuity between this supply circuit and a voltage distinct from that of the phase in question, such as that of a neutral conductor.

Hence in a meter connected to a polyphase network the measuring devices and their supply are brought to voltages which may be very different from one another and fluctuate within rather wide limits with respect to one another. The result is that the summator of pulses at the output from these circuits must normally be galvanically insulated with respect to at least certain of them. Further it is desirable that its supply may be derived directly from the network without involving any costly voltage transformer. This supply must function whatever the number of phases of the polyphase network which are effectively under voltage, in order to account for the power which is flowing even through only one phase if the other phases of the network are interrupted.

It is in addition desirable to achieve this supply with a minimum of components.

DISCLOSURE OF INVENTION

The object of the invention is a device for measuring a quantity in a polyphase alternating current electrical distribution network which includes at least one first and one second phase conductor and one reference conductor, of the type comprising a first and a second electronic measuring device for producing a signal representative of the said quantity measured respectively on the first and the second phase conductor, and a summation device providing the sum of the signals so produced, characterized by the fact that the measuring device further comprises a first supply circuit connected to the first phase conductor in order to apply a continuous supply voltage to the first measuring device, a supply device connected to the second phase conductor in order to apply a continuous supply voltage to the second measuring device and a continuous supply voltage to the summation device, and a high-impedance tie circuit connected between the first supply circuit and the supply device, the arrangement being such that the summator device is supplied as soon as one of the phase conductors is under voltage with respect to the reference conductor.

The high-impedance tie circuit is thus employed not only for the supply to the first measuring device but also for the supply to the summation device. An appreciable economy of components results from this.

In a first embodiment, the supply device comprises a second supply circuit connected to the second phase conductor in order to apply a continuous supply voltage to the second measuring device, a second high-impedance tie circuit connected to the second supply circuit and an auxiliary supply circuit connected between the two tie circuits and the reference conductor in order to apply to the summation device a supply voltage which is substantially stable with respect to the voltage of the reference conductor.

The high-impedance tie circuits being connected between the respective supply circuits to the measuring devices and the auxiliary circuit, the latter can "float" with the voltage of the reference conductor, protected from overvoltages.

In another embodiment the supply device consists of a second supply circuit identical with the first, the summation device being connected for its supply to this second supply circuit and to the second phase conductor.

In this case, as the second measuring device and the summation device are supplied through the same circuit, one supply circuit is saved. Again, one can dispense with a connection having galvanic insulation between the second measuring device and the summation device.

BRIEF DESCRIPTION OF DRAWINGS

Other aspects and advantages of the invention will become evident from reading the description below of various embodiments, made with reference to the attached drawings in which.

DETAILED DESCRIPTION OF THE INVENTION

Figure 1:
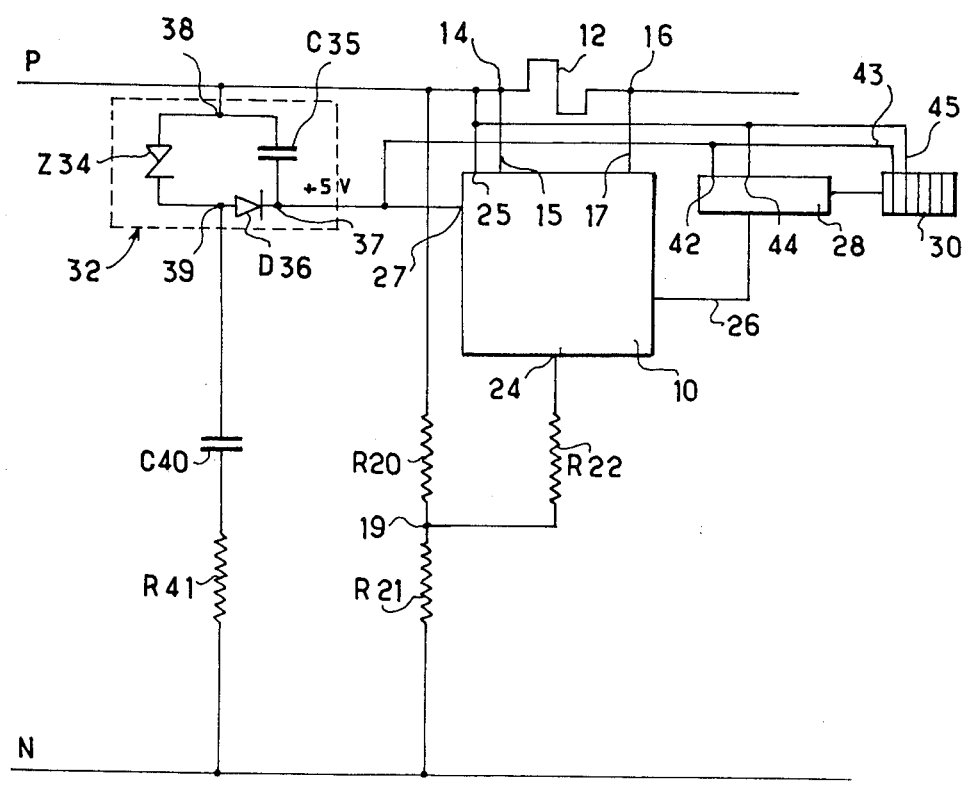
FIG. 1 is a connection diagram of an electronic device for metering power, the principle of which is employed in the device as FIG. 2.

In FIG. 1 is represented an electronic power metering device connected between a neutral conductor N and a phase conductor P of a singlephase electric power distribution network for a domestic installation at a voltage, for example, for 110 or 220 volts.

This device corresponds to that shown in U.S. Pat. No. 4,359,684. It includes essentially an electronic metering circuit 10 realised in the form of a large scale integrated circuit (LSI), connected without any transformer to the singlephase alternating current network P,N. A shunt 12 is interposed in the phase P, to the terminals 14 and 16 of which is connected the metering circuit 10 in order to supply between its inputs 15 and 17 a voltage proportional to the current flowing in the live wire or conductor of phase P. The metering circuit 10 is furthermore connected through a resistor R22 to the junction 19 in a voltage divider R20, R21 which is connected between the phase conductor P and the neutral N. The resistor R21 has a value much higher than the resistor R20 so that the voltage between the junction 19 of the two resistors and the phase conductor P is relatively low, and supplies to the inputs 24 and 25 of the metering circuit a signal representative of the phase voltage of the order of 0.5 volts.

The metering circuit carries out the product of the instantaneous voltage signal which is present between its inputs 24, 25 and the signal representative of the instantaneous current which is present between the inputs 15, 17, and the conversion of this product into pulses the frequency of which is proportional to the power flowing through the phase P. These pulses are transmitted to the output 26 of the metering circuit in order to be summed in an electronic summing meter 28 the output from which is connected to a display device 30, for example, of liquid crystal type.

In order to supply the metering circuit 10, the summation device 28 and its display device 30, a supply 32 is connected without any transformer between the phase conductor P and the neutral conductor N. It includes a parallel assembly of a Zener diode Z34 and a series circuit formed of a capacitor C 35 and a diode D36. One end 38 of this parallel assembly is connected to the phase conductor P and the other end 39 of this assembly is connected to the neutral conductor N by way of a capacitor C40 and a resistor R41 in series. The junction 37 between the capacitor and the diode is connected to one supply input 27 to the circuit 10.

The tie circuit formed by the capacitor C40 and the resistor R41 exhibits a relatively high-impedance in order to make the voltage drop between the junction 39 and the neutral N whilst minimizing the power losses, in particular of active power in accordance with the standards imposed in the field of electric power metering.

The capacitor C40 is dimensioned so as to be the source of the greater part of this voltage drop without consumption of active power. A relatively low portion of this voltage drop is due to the resistor R41 which is intended to attenuate the surges in the network so as to protect the supply circuits 32 to which it is connected.

When the phase and neutral conductors are fed by an alternating voltage at the nominal frequency of the network, the Zener diode Z34 delivers at its terminals a voltage in rectangular pulses the amplitude of which may, for example, be equal to 5 volts, being the value to which it charges the capacitor C35 by way of the diode D36 so that the voltage of the junction 37 with respect to the phase conductor P is established at a practically continuous value of +5 volts. This voltage is employed for supplying the metering circuit 10 through its inputs 25 connected to the phase P and 27 connected to the junction 37.

The summation device 28 and the display device 30 are likewise connected to the supply 32 by way of respective conductors 42 and 43 connected to the junction 39, and 44, 45 connected to the phase P.

When the network is energised, the circuit 32, the metering circuit 10, the summator 28 and its display device 30 "float" electrically at the phase voltage, all of the voltages applied being referred to the voltage of the phase P.

Figure 2:
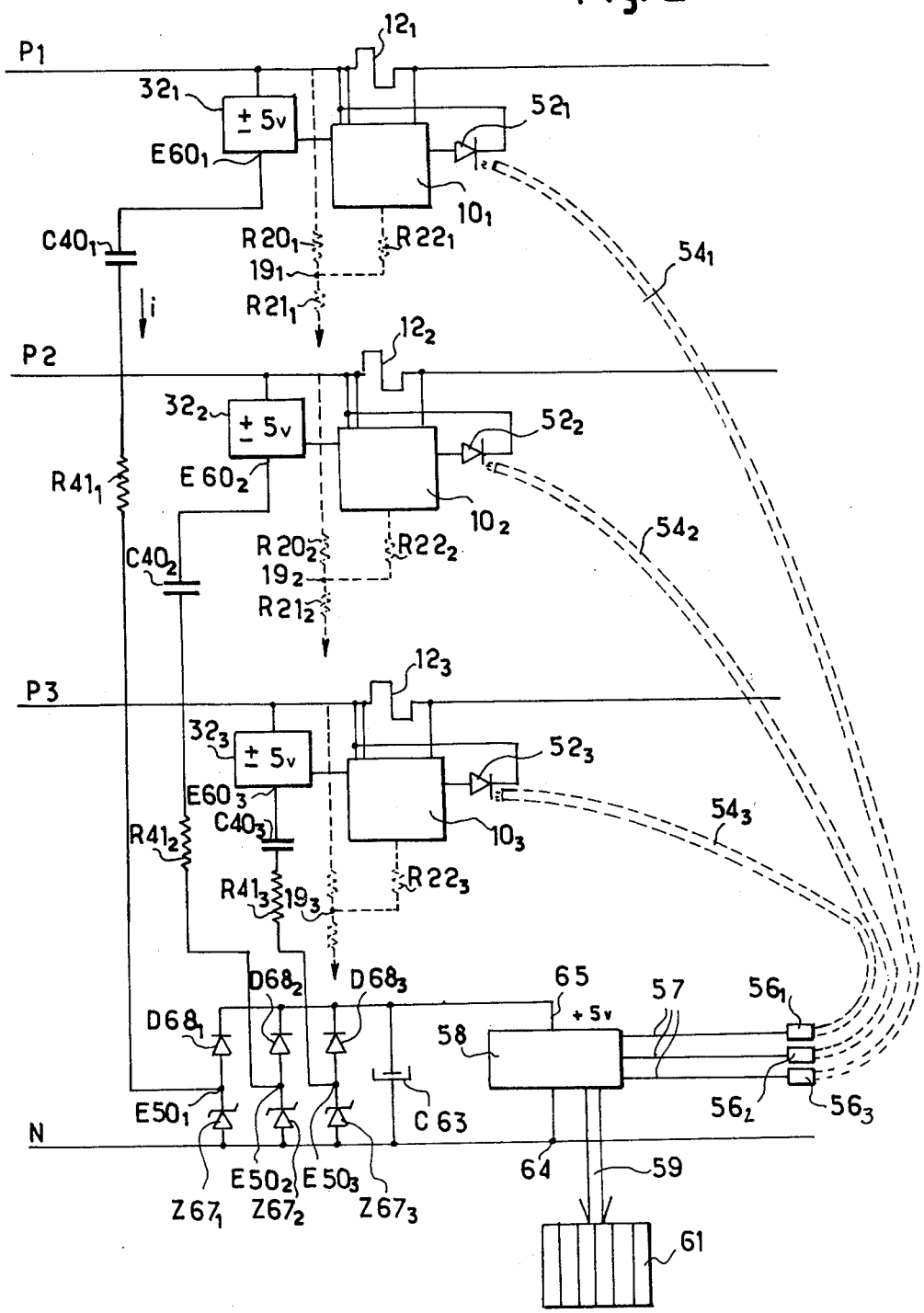
FIG. 2 represents a device in accordance with the invention, in the case of the measurement of power in a threephase fourwire network.

FIG. 2 represents a device which employs assemblies such as that in FIG. 1 for the metering of the power being transmitted to a threephase fourwire circuit, that is to say, having three phase conductors P1, P2, P3 and a neutral conductor N which may be connected to earth or not.

With each of the phases P1, P2, P3 is associated a metering circuit $10_1$, $10_2$, $10_3$ respectively. These metering circuits receive a signal representative of the current in the respective phase from shunts $12_1$, $12_2 12_3$ and a voltage signal by means of respective resistors and voltage dividers, shown in dotted lines in FIG. 2 and connected between the respective phase and the neutral conductor, these dividers being marked with the references $R20_1$–$R21_1$, $R20_2$–$R21_2$ and $R20_3$–$R21_3$. In general, the components identical with those of FIG. 1 are marked with identical reference numbers provided with the index of the phase with which they are associated.

In order to ensure the feeding of each of the metering circuits $10_1$ to $10_3$, respective supply circuits $32_1$, $32_2$ and $32_3$, are provided, connected in a similar way to the supply 32 in FIG. 1.

In particular, each of these supply circuits is connected to the neutral by way of a high-impedance tie circuit which includes a capacitor such as $C40_1$ in series with a resistor such as $R41_1$ for the supply circuit $32_1$, each of these circuits playing the part indicated previously in relation to the circuit C40, R41.

Each metering circuit $10_1$ to $10_3$ has an output which feeds an electroluminescent diode, $52_1$ to $52_3$ respectively, associated with one end of a respective optical fibre connection $54_1$ to $54_3$, the opposite end of which transmits to the respective inputs of a phototransistor $56_1$ to $56_3$ light pulses which correspond with the output pulses from the circuit $10_1$ to $10_3$. The phototransistors $56_1$ to $56_3$ are connected by conductors 57 to the inputs to a summing circuit 58 of known design which carries out the summation of the pulses received over its three inputs, proceeding from the phototransistors $56_1$ to $56_3$.

This summing circuit is connected by a multi-wire connected 59 to a liquid crystal display device 61 which indicates the power measured by the threephase meter. The summing means and its display system may equally well be carried out by any other equivalent system, for example, a solenoid the excitation of which per pulse may cause the rotation by way of a ratchet wheel of a cyclometer summing device in accordance with a principle employed in telephone meters or by means of a stepping motor which drives a cyclometer summator in response to each pulse.

The optical connections $54_1$ to $54_3$ are intended to achieve a suitable insulation between the summing circuit 58 on the one hand and each of the phases P1 to P3 as well as between these phases, their respective voltage levels being very different.

It is in addition necessary that the system of summation and display employed for the threephase meter can operate even if only one of the phases is supplied, the two others being without voltage, and it is quite desirable to employ the current provided by the network across which the meter is connected in order to make it operate. For this purpose the summing circuit 58 is supplied at a continuous voltage of +5 volts with respect to the neutral conductor in the following manner.

An electrolytic capacitor C63 is connected between two supply terminals 64 and 65 of the summator 58, the terminal 64 being connected to the neutral conductor N. In parallel with the capacitor C63 there are likewise connected three rectifier circuits each including one Zener diode $Z67_1$ to $Z67_3$ and one rectifier diode $D68_1$ to $D68_3$, connected in the sense going from the terminal 64 towards the terminal 65. Each of these rectifier circuits is connected to one of the high-impedance tie circuits already mentioned which have each one end $E60_1$ to $60_3$, connected to the input to the corresponding supply circuit $32_1$ to $32_3$, their other end $E50_1$ to $E50_3$ being connected into the corresponding rectifier circuit at the junction between the respective Zener diode and rectifier diode.

Thus in operation each of the Zener diodes $Z67_1$ to $Z67_3$ delivers at its terminals a voltage in rectangular pulses of amplitude slightly higher than 5 volts which tends to keep the capacitor C63 charged through the diodes $D68_1$ to $D68_3$ at a voltage of about 5 volts taking into account the inherent voltage drop in the diodes. Hence the capacitor C63 supplies the inputs 64 and 65 of the summing circuit 58 at a stable continuous voltage. It will be observed that each parallel rectifier circuit connected to the junctions $E50_1$ to $E50_3$ achieves in combination with the capacitor C63 an independent stabilized supply, which enables a supply voltage to be obtained by the summing circuit as soon as one of the phases P1, P2 or P3 is placed under voltage with respect to the neutral conductor N or conversely as long as at least one of these phases remains in service. It may likewise be observed that the circuitry which has just been described prevents any inter-action between the high-impedance circuits associated with the supplies $32_1$ to $32_3$ thanks to the blocking carried out by the diodes $D68_1$ to $D68_3$ which play the part of an OR logical function with respect to the supply input signals to the summing circuit 58.

The realisation of this supply circuit may undergo various modifications. For example, if one refers to FIG. 3 one can save a number of Zener diodes by employing one single stabilizer Zener diode Z70 connected in parallel with the capacitor C63 and connected directly to the supply terminals 64 and 65 of the summing circuit 58. Besides the Zener diode Z70, three series rectifier circuits are mounted in parallel on the terminals 64 and 65 and are each connected to one end $E50_1$, $E50_2$ or $E50_3$ of a respective high-impedance tie circuit.

Each of these rectifier circuits includes two diodes in series oriented in the sense from the terminal 64 towards the terminal 65 and marked with the references $D71_1$ and $D72_1$ for the circuit connected to the second end $E50_1$ at the junction of these diodes, the other circuits consisting of series circuitry of diodes of identical numbered subscripts corresponding with the phase with which they are associated.

Each of the circuits D71–D72 supplies a rectified and stabilized voltage at the level fixed by the Zener diode Z70 on the capacitor C63 in order to supply the summation circuit 58. The rectifier circuits act independently of one another and it is sufficient for one of them to be excited for the summing circuit to be supplied.

It is possible to achieve by means of the principles described a two-pole supply for the summation and display circuits 58 and 61, or again any other circuit for development of the data proceeding from the metering circuits $10_1$ to $10_3$, such a supply providing two continuous supply voltages of opposite polarities.

Figure 4:
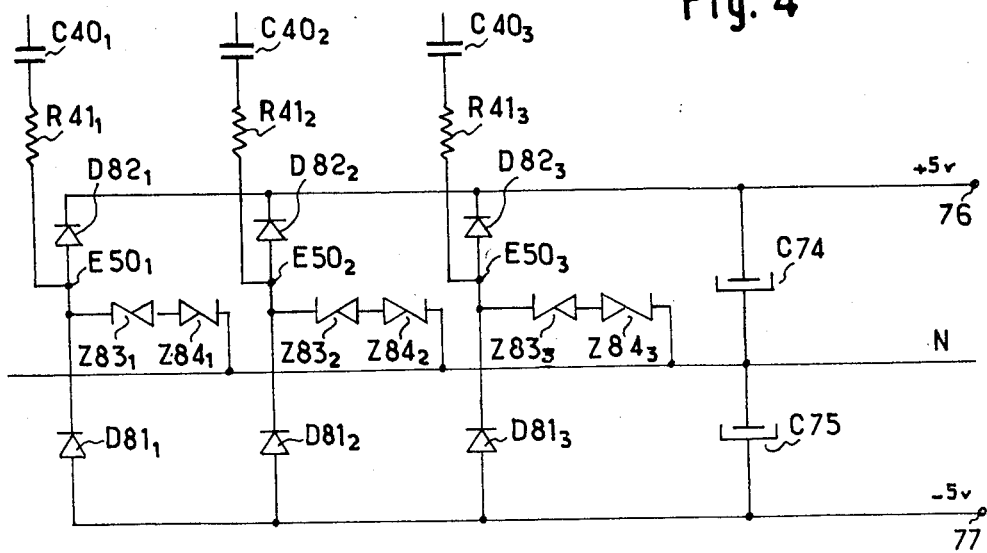
FIG. 4 represents another variant embodiment.

FIG. 4 represents such an embodiment in which two capacitors C74 and C75 are connected to the neutral N by one of their plates, the other plate of C74 being connected to a terminal for supply at a continuous voltage of +5 volts whilst the other plate of the capacitor C75 is connected to a terminal 77 for supply at a continuous voltage of −5 volts.

Three rectifier circuits are provided, each associated with one of the phases P1 to P3 by way of the second end $E50_1$ to $E50_3$ of the corresponding high-impedance tie circuit. This end is connected to the junction of two diodes oriented from the terminal 77 towards the terminal 76 and respectively marked by the reference numbers D81 and D82 with indices corresponding with the phase with which they are associated.

Between each of the ends $E50_1$ to $E50_3$ and the neutral N there are likewise connected two Zener diodes in opposition Z83 and Z84, having subscripts corresponding with their associated phase, so as to keep the voltage between the points $E50_1$ to $E50_3$ and the neutral at one of the two equal and opposite values on opposite sides of the voltage of the neutral conductor N, depending upon the polarity of the current flowing in the respective high-impedance circuit. Each of the Zener diodes Z83 stabilizes the voltage at the terminals of the capacitor C74 at a positive value whilst each of the Zener diodes Z84 acts in the same way to keep the voltage at the terminals of the capacitor C75 at a value equal but negative. As previously, the arrangement of the circuitry of the diodes D81 and D82 achieves an OR logical function which prevents any interaction between the high-impedance tie circuits.

It will be noted that thus with a minimum of components a supply has been achieved for a circuit such as the summing circuit 58 and its display device 61, which is developing pulses proceeding from the electronic measuring devices associated with each of the phases of a polyphase network such as the metering circuits $10_1$ to $10_3$. That is, the supply to this exploitation circuit makes use of the same high-impedance circuit as each of the individual supplies to the measuring circuits such as $32_1$ to $32_3$. These circuits which form a source of current for the supplies $32_1$ to $32_3$ play each the same part for the supply to the common exploitation circuit (summing circuit display device) which has just been described. The use of these high-impedance circuits is thus brought to an optimum whilst minimizing the number of components required, each enabling not only that the supply to the associated measuring device float with the voltage of the corresponding phase, but likewise that the supply to the common exploitation circuit be carried out with reference to the voltage of the neutral, protected from the surges which are capable of affecting the network, whilst a galvanic insulation is maintained between the outputs from the measuring devices associated with each phase and the inputs to the exploitation circuit.

Figure 5:
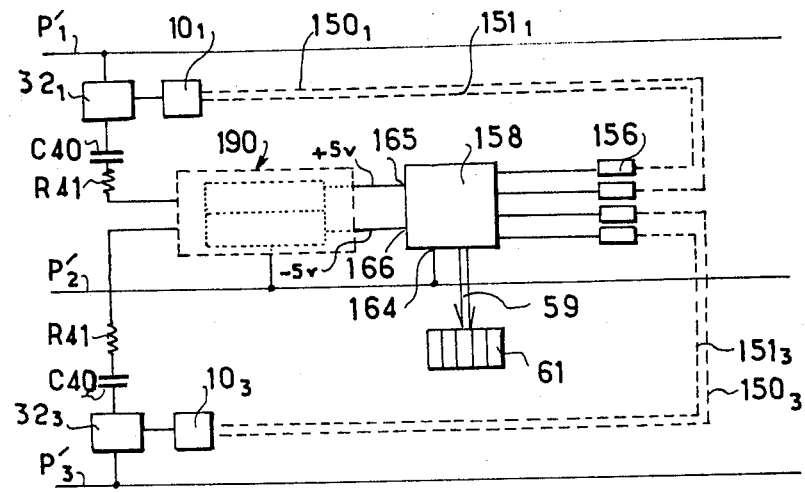
FIG. 5 shows a device intended for measuring power in the case of a threephase threewire network.

In FIG. 5 is represented a threephase network of three wires P'1, P'2 and P'3, equipped with two devices for measuring the power between phases, one of them $10_1$ being connected between the phases P'1 and P'2 and the other $10_3$ between the phases P'3 and P'2. The phase P'2 is here a common conductor the normally variable voltage of which is taken as reference not only for the measurement of the input voltages to the metering circuits $10_1$ and $10_3$ but likewise for the supply voltage for the corresponding circuits $32_1$ and $32_3$.

Figure 3:
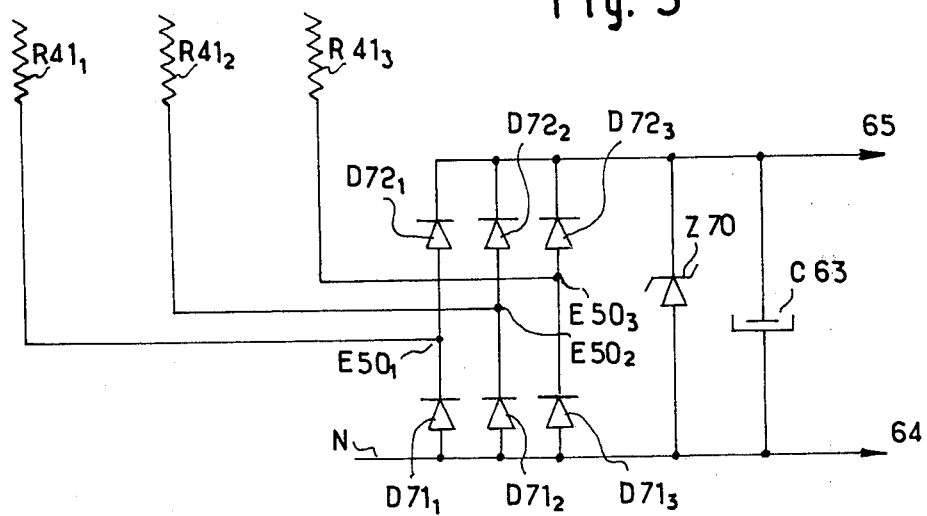
FIG. 3 represents a variant in embodiment with respect to the device as FIG. 2.

The same reference numbers have been employed for designating the same parts as in the FIGS. 2 to 4. Only the few differences with what has gone before are tackled in greater detail below.

With each of the measuring devices $10_1$ and $10_3$ are associated two optical connections $150_1$, $151_1$ and $150_3$, $151_3$.

For each measuring device, one of these optical connections is intended to convey pulses corresponding with a metering of the power flowing in one sense with respect to the device, whilst the other connection is allotted to the pulses corresponding with the metering of the power in the opposite sense. Each of these optical connections $150_1$, $150_3$, $151_1$, $151_3$ terminates at a phototransistor 156 connected to the summation circuit 158 which carries out the addition of the pulses corresponding with the power flowing in one sense and the subtraction of the pulses corresponding with the power detected in the other sense. This circuit 158 is supplied from a supply circuit 190 which delivers two continuous voltages of ±5 volts to the inputs 165 and 166 of the circuit 158, taken off with respect to the reference voltage of the phase P'2 connected to its input 164. This circuit 190 is supplied from the voltages between the phases P'1 and P'2 and between the phases P'3 and P'2 or from only one of these two voltages by way of high-impedance circuits C40, R41 respectively associated with the supply circuits $32_1$ and $32_3$. It is carried out, for example, in a similar fashion to the representation as FIG. 4, only the components allotted the index 2 being eliminated. It "floats" electrically as well as the circuit 158 with the voltage of the phase P'2. One may likewise by referring to FIG. 6 consider an assembly for the metering of the power delivered through an opposed twophase threewire circuit, that is to say, including two phase conductors P''1 and P''2 supplied at voltages in opposition (180° phase shift) with respect to a neutral N''.

In this case each measuring device $10_1$, $10_2$ is associated with only one optical connection $250_1$, $250_2$ in the direction of a summation circuit 258 which carries out the addition of the pulses received, proceeding from the two circuits $10_1$ and $10_2$. A supply 290 which may be of the single-pole type represented in FIG. 3 supplies a voltage stabilised with respect to the voltage of the neutral N'' to the input 264 to the summing circuit 258. This supply has two inputs to which are connected the ends $E50_1$ and $E50_2$ of the high-impedance circuits $C40_1$ and $C40_2$ associated respectively with the supplies $32_1$ and $32_2$ to the devices $10_1$ and $10_2$.

Figure 6:
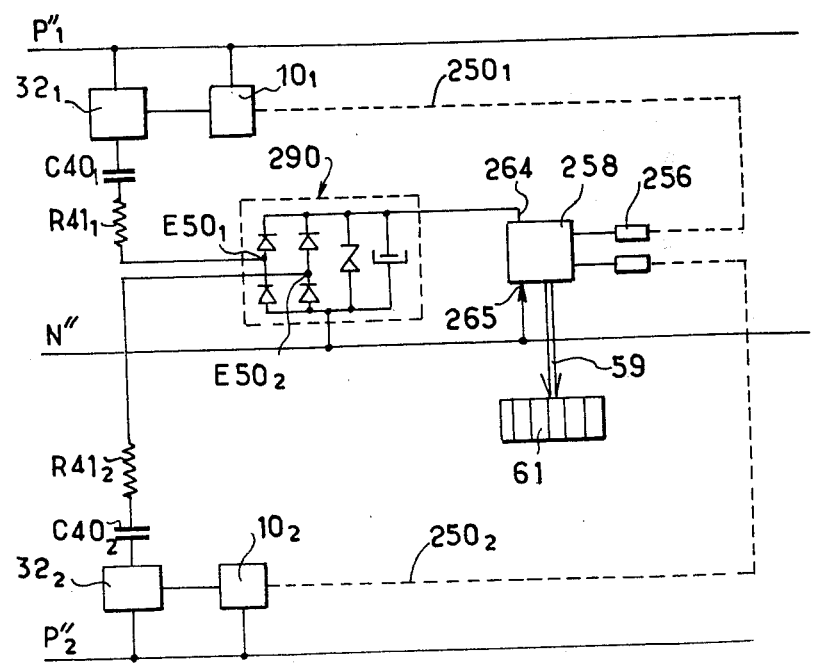
FIG. 6 represents a device intended for the measurement of power in the case of a network having two phases in opposition and a neutral conductor.
Figure 7:
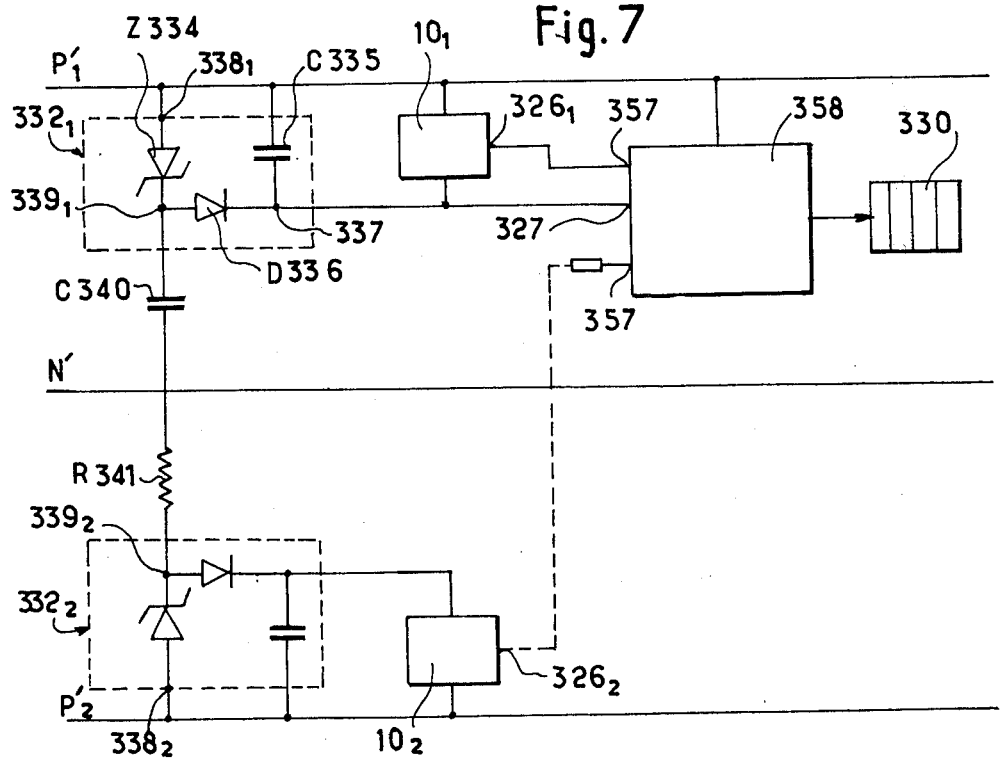
FIG. 7 represents another embodiment of the invention in the case of a network having two phases in opposition and a neutral conductor.

FIG. 7 represents another embodiment for the metering of the power in an opposed twophase network of three wires P'1, P'2 and N', similar to that as FIG. 6. Two electronic measuring devices $10_1$ and $10_2$ are associated respectively with the phase conductors P'1 and P'2 and their outputs $326_1$ and $326_2$ are connected to the inputs 357 to a summing circuit 358.

Each device $10_1$ and $10_2$ is supplied by a respective supply circuit $332_1$, and $332_2$ carried out like the supply 32 in FIG. 1 by means of a Zener diode Z334, a diode D336 and a capacitor C335. The supply $332_1$ is connected to the phase P'1 by its input $338_1$ and the supply $332_2$ is connected to the phase P'2 by its input $338_2$. The inputs $339_1$ and $339_2$ (to the junction between the Zener diode Z334 and the diode D336 of each supply) are connected by a common high-impedance tie circuit C340, R341 so that each of the supplies $332_1$ and $332_2$ derives its input power from the two phases P'1 and P'2, each of them floating electrically, as well as its associated measuring device $10_1$, $10_2$ with the voltage of the respective phase P1, P2 at one of the respective ends $339_1$, $339_2$ of the high-impedance tie C340, R341.

Contrary to the embodiments previously described, no specific supply circuit is provided for the summing circuit 358. The latter is supplied from the supply $332_1$ through a connection 337, 327 and floats electrically with the phase P'1. Neither of the supplies $332_1$, $332_2$ is connected to the neutral conductor and it may be noted that the summing circuit 358 can continue to operate in the event of a short-circuit between one of the phases and the neutral in order to meter the power delivered through the other phase.

The summing circuit 358 and the measuring device $10_1$ being supplied by the same circuit $332_1$, it is not necessary to provide between them a connection by optical conductor to ensure galvanic insulation, which constitutes an appreciable saving. On the other hand the connection between the output $326_2$ from the measuring device $10_2$ and the input 357 to the summing circuit must be insulated and is carried by an optical conductor represented in dotted lines.

Figure 8:
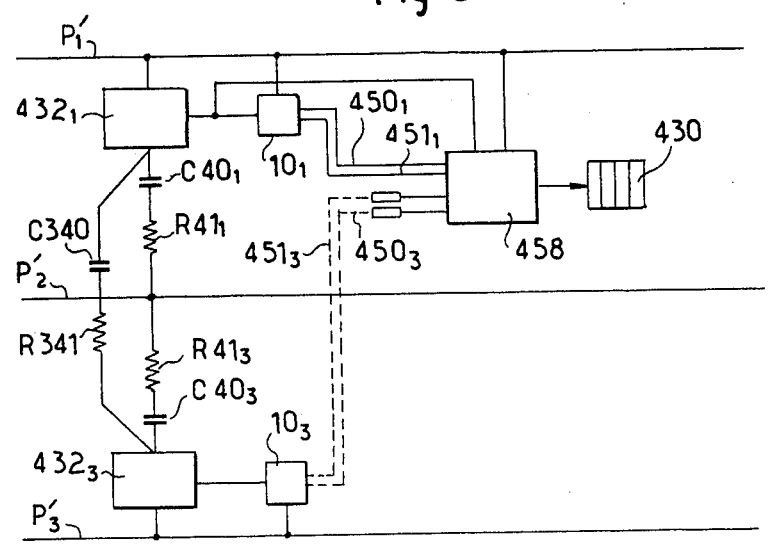
FIG. 8 represents a device of the same type as that in FIG. 7 intended for the measurement of power in the case of a threephase threewire network.

FIG. 8 shows a device of the same type intended for a threephase threewire network such as that described in connection with FIG. 5.

As has been said, the wire P'2 is taken as the reference conductor for the measurement of the input voltages to the metering circuits $10_1$ and $10_3$.

The metering circuits $10_1$ and $10_3$ are supplied respectively by supply circuits $432_1$, $432_3$ identical with the circuits $332_1$, $332_2$ of FIG. 7.

The supply circuits $432_1$, $432_3$ are connected directly to the reference conductor P'2 by high impedance tie circuits each formed of a capacitor $C40_1$ and $C40_3$, respectively and a resistor $R41_1$ and $R41_3$, respectively. In addition as in the device as FIG. 7, the supply circuits are connected together by a high-impedance circuit formed of the capacitor C340 and the resistor R341.

The summing circuit 458 with which is associated a display device 430 is supplied by the supply circuit $432_1$ and connected to the phase P'1 and "floats" with the voltage of the phase P'1 just like the measuring device $10_1$.

Thanks to the direct connection C340, R341 between the supply circuits, the summing circuit 458 is supplied even in the even of short-circuit between the phases P'1 and P'2, the circuit $432_3$ then ensuring the supply to the summator.

As in the case of FIG. 5, two connections are necessary between each measuring device and the summing circuit 458, each connection transmitting the pulses corresponding with one sense of flow of the power.

The connections between the measuring device $10_3$ and the summing circuit 458 are carried out by optical conductors $450_3$ and $451_3$ which ensure the galvanic insulation. On the contrary the connections $450_1$ and $451_1$ between the measuring device $10_1$ and the summing circuit 458 are simple electrical connections, insulation being then superfluous since these two components are supplied by the same circuit.

I claim:

1. In a device for measuring a quantity in a polyphase alternating current electrical distribution network which includes at least one first and one second phase conductor and one reference conductor, the device being of the type comprising a first and a second electronic measuring device for producing a signal representative of said quantity measured respectively on the first and the second phase conductor, and a summing device for providing the sum of the signal so produced, the device further including means for powering the electronic measuring devices and the summing device comprising:

a first supply circuit connected to the first phase conductor for supplying a continuous supply voltage to the first measuring device, a supply device connected to the second phase conductor for supplying a continuous supply voltage to the second measuring device and a continuous supply voltage to the summing device, and a high-impedance tie circuit having a first end connected to the first supply circuit and a second end connected to the supply device, wherein the summing device is supplied with operating voltage so long as a potential difference exists between one of the phase conductors and the reference conductor.

2. A device as in claim 1, wherein
   the supply device comprises a second supply circuit connected to the second phase conductor in order to apply a continuous supply voltage to the second measuring device, a second high-impedance tie circuit connected to the second supply circuit and an auxiliary supply circuit connected between the two tie circuits and the reference conductor in order to apply to the summing device a supply voltage which is substantially stable with respect to the voltage of the reference conductor.

3. A device as in claim 2, wherein
   the auxiliary supply circuit comprises a common conductor connected to the summing device, a capacitor connected between the common conductor and the reference conductor, at least one Zener diode connected in parallel with the capacitor, and rectifier circuits connected between the reference conductor and the common conductor and connected respectively to the said tie circuits, the whole of the rectifier circuits forming an OR logical function.

4. A device as in claim 3, wherein
   each tie circuit comprises a capacitor and a resistor in series and each rectifier circuit comprises two diodes connected on opposite sides of the corresponding end of the respective tie circuit.

5. A device as in claim 2, wherein
   the auxiliary supply circuit comprises a common conductor connected to the summing device, a capacitor connected between the common conductor and the reference conductor, and for each tie circuit a rectifier circuit connecting the corresponding end of the respective tie circuit to the common conductor by way of a diode and to the reference conductor by way of at least one Zener diode, the whole of the rectifier circuits forming an OR logical function.

6. A device as in claim 5, wherein,
   in order to ensure two-pole supply to the summing device the auxiliary circuit comprises a second common conductor connected to the summing device, a second capacitor connected between the second common conductor and the reference conductor, and for each tie circuit a diode connecting the said end of the tie circuit to the second common conductor and two Zener diodes connecting the said end to the reference conductor.

7. A device as in claim 2, wherein the connections between the respective meauring devices and the summming device are insulated galvanically.

8. A device as in claim 1, wherein the supply device consists of a second supply circuit identical with the first, the summing device being connected for its supply to this second supply circuit and to the second phase conductor.

9. A device as in claim 8, wherein each supply circuit comprises a Zener diode connected between the respective end of the tie circuit and the respective phase conductor, a capacitor in parallel with the Zener diode and a diode connected between the said end and the terminal of the capacitor connected to the said end.

10. A device as in claim 8, wherein only the connection between the first measuring device and the summing device is insulated galvanically.

11. A device as in claim 8, wherein each supply circuit is in addition connected to the reference conductor through a high-impedance tie circuit.

12. A device as in claim 2, for a network including a third phase conductor and a neutral conductor as a reference conductor, comprising a third measuring device associated with the third phase conductor, a third supply circuit connected to the third phase conductor and a third high-impedance tie circuit connected between said third supply circuit and said auxiliary supply circuit in order to apply a supply voltage which is continuous and substantially stable with respect to the voltage of the third phase conductor, to the third measuring device.

13. A device as in claim 1, in which the quantity measured is electric power.

* * * * *